US005682292A

United States Patent [19]

Salanki

[11] Patent Number: 5,682,292

[45] Date of Patent: Oct. 28, 1997

[54] LIQUID-COOLED VALVE REACTOR

[75] Inventor: Tibor Salanki, Erlangen/Bundesrepublik, Germany

[73] Assignee: Siemens Aktiengesellschaft, München, Germany

[21] Appl. No.: 535,245

[22] PCT Filed: Mar. 31, 1994

[86] PCT No.: PCT/DE94/00364

§ 371 Date: Oct. 30, 1995

§ 102(e) Date: Oct. 30, 1995

[87] PCT Pub. No.: WO94/27304

PCT Pub. Date: Nov. 24, 1994

[30] Foreign Application Priority Data

Oct. 5, 1993 [DE] Germany ........................... 9307081 U

[51] Int. Cl.$^{6}$ ........................................ H05K 7/20

[52] U.S. Cl. ........................ 381/699; 257/718; 336/62; 336/92; 336/96; 336/100; 336/197; 361/707; 361/715

[58] Field of Search ............................ 257/718–719, 257/726–727; 336/62, 67, 68, 90, 96, 100, 205; 361/677, 689, 598–699, 836, 704, 707, 715

[56] References Cited

U.S. PATENT DOCUMENTS

| | | | |
|---|---|---|---|
| 4,009,461 | 2/1977 | Usry | 336/197 |
| 4,663,604 | 5/1987 | van Schaick | 336/96 |
| 4,775,848 | 10/1988 | Sundermann et al. | 336/62 |
| 5,220,484 | 6/1993 | Seri | 361/690 |

FOREIGN PATENT DOCUMENTS

| | | | |
|---|---|---|---|
| 0 223 954 | 6/1987 | European Pat. Off. . | |
| 2 619 164 | 2/1989 | France . | |
| 4230098 | 8/1992 | Japan | 361/677 |
| 0 649 648 | 5/1985 | Switzerland . | |
| WO84/00638 | 2/1984 | WIPO . | |
| WO90/14674 | 11/1990 | WIPO . | |

*Primary Examiner*—Gregory D. Thompson

*Attorney, Agent, or Firm*—Kenyon & Kenyon

[57] ABSTRACT

The invention relates to a liquid-cooled valve reactor, in particular for a high-voltage DC transmission installation, including a reactor core (2) and a reactor coil (4), the reactor coil (4) including a primary winding (24), which comprises two cooled winding sections (30, 32), and a secondary winding (26), and the reactor core (2) being provided with a plastic jacket (14). According to the invention, the reactor core (2) is provided with a clamping frame (56) which has on its free surfaces (58) in each case a heat dissipator (60), a liquid-cooled secondary resistor (28) is provided, which is connected electrically in parallel to the secondary winding (26), and the encapsulated reactor core (2) and the reactor coil (4) are mounted on a baseplate (6). The result is an intensively cooled valve reactor.

11 Claims, 4 Drawing Sheets

FIG. 4
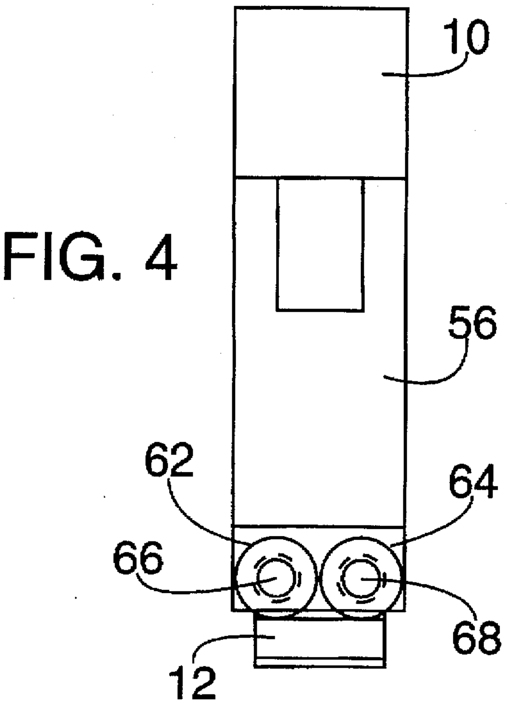
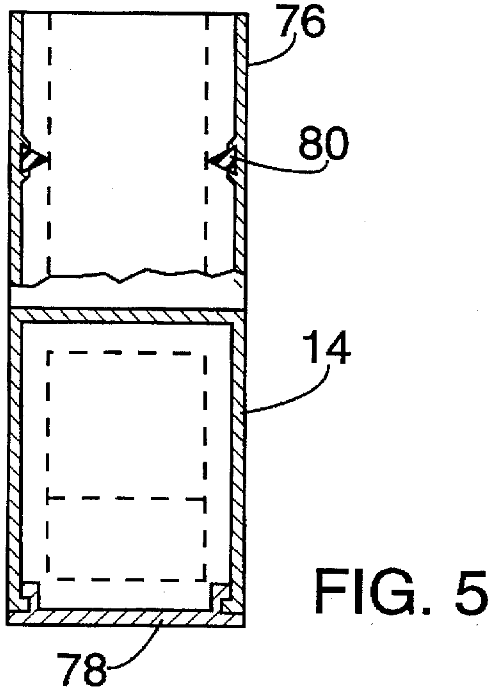
FIG. 5

LIQUID-COOLED VALVE REACTOR

FIELD OF THE INVENTION

The invention relates to a liquid-cooled valve reactor, in particular for a high-voltage DC transmission installation.

BACKGROUND OF THE INVENTION

For the purpose of distributing electrical energy, high-voltage DC transmission (HVDCT) systems are generally used today as the link element between two three-phase current systems. Line-commutated, controllable semiconductors convert the three-phase current at the transmitting end into direct current for transmission, and back again into three-phase current at the receiving end. The highest achievable thyristor voltage is small by comparison with the valve voltage required for economical transmission. It is therefore necessary to connect a multiplicity of thyristors in series for an HVDCT valve. In order to limit the rate of current rise in an HVDCT valve, a valve reactor having a liquid-cooled reactor coil and reactor core is additionally connected here in series to the individual thyristors in each case.

For the purpose of economical manufacture and of achieving only short down-times in the case of necessary repairs, each HVDCT valve includes, depending on the voltage which is to be controlled, a relatively large or relatively small number of identical thyristor modules and reactor modules which are combined structurally in the form of a tower in a tower-type basic frame.

A known valve reactor is disclosed in WO90/14674. In this valve reactor, the reactor core is surrounded on all sides by a noise-deadening insulating module casing which serves at the same time as a support frame and around which the winding is held on the support module casing of the reactor S outside.

The reactor core is assembled from two U-shaped subcores, in particular cut strip-wound cores. The insulating module casing is assembled correspondingly in accordance with the U-shaped subcores from two trouser-shaped insulating module subcasings which are situated opposite one another with their limb ends open and whose openings on the waist side can be sealed by a cover after the insertion of the U-shaped subcores.

EP 0 223 954 A1 discloses a further embodiment of a valve reactor, in particular for high-voltage DC transmission installations. In this embodiment, the reactor coil is encapsulated on all sides of the winding and the encapsulated block thereby produced is mounted via rubber buffers in a surrounding plastic clamping frame. The reactor core comprises two U-shaped subcores and, via tie-rods, is fastened unencapsulated likewise in the clamping frame. The winding is cooled by the use of hollow conductors. For cooling purposes, the reactor core bears cooling pockets placed on the outside at one end. For noise-deadening purposes, the entire arrangement constructed in this way is shielded by an outer deadening jacket, joining and connecting pieces of the liquid coolant feeder being situated, at least partly, inside the deadening jacket.

In the known valve reactors, cooling is achieved by means of heat dissipators which are placed on or wound in the system. As a result, the heat produced in the cores cannot be dissipated with high efficiency. Furthermore, the core halves are held together, as in the case of cut stripwound cores, by clamping bands which lack reliability in the case of large cores such as reactor cores. These clamping bands therefore often have to be reclamped.

SUMMARY OF THE INVENTION

The present invention overcomes the shortcomings of the prior art by providing a liquid-cooled valve reactor which no longer has the disadvantages set forth. According to the present invention, a liquid-cooled valve reactor, in particular for a high-voltage DC transmission installation, has two U-shaped reactor subcores and a reactor coil. Each of said subcores has an insulating casing and is braced by means of a clamping frame. The clamping frame has surfaces on which is mounted a heat dissipator. The reactor coil has a primary winding with two winding sections wound from a hollow conductor and a secondary winding. The reactor sub-cores are each provided with a liquid-cooled secondary resistor which is connected electrically in parallel with the secondary winding. The reactor core and the reactor coil are mounted on a baseplate.

Because of the fitting of heat dissipators on the free surfaces of the clamping frame of the reactor core, the frame serves not only as a fastening element for the U-shaped reactor subcores, but at the same time it serves as a heat dissipator. Since the reactor core has two cooling ducts, the assembled reactor core can be intensively cooled on two different sides. This heat dissipator dissipates heat absorbed by the frame. Since liquid, in particular water, can used as a cooling medium, the heat produced in the subcores can be dissipated by the liquid with high efficiency.

Because of the fitting of a liquid-cooled secondary resistor, which is connected electrically in parallel with the secondary winding, the damping ratio of the reactor is increased. That is to say, the damping of the reactor is no longer set only by the configuration of the reactor core. As a result, a large proportion of the power loss of the valve reactor is shifted onto the secondary resistor, where this power loss can be dissipated with high efficiency.

Furthermore, the cores and the winding parts are mounted on a baseplate which has a distribution pipe and a collecting pipe for the liquid coolant. Owing to the self-supporting arrangement of the cores, in which these are connected to the baseplate by means of buffers, transmission of structure-borne sound is prevented.

The heat dissipator may include at least two cooling ducts disposed with connections at one end of said heat dissipator, wherein the cooling ducts are connected to one another by a connecting pipe.

The baseplate may have a distribution pipe and a collecting pipe for liquid coolant. The distribution pipe and the collecting pipe are then connected to the subcores via at least one cooling line.

Further improvements are also possible. The liquid-cooled secondary resistor can be a stainless steel pipe. The secondary winding can have only one turn with the turn disposed with the winding section of the primary winding. Also, the insulating casing of each reactor subcore includes two separate joinable portions. Furthermore, a buffer can be connected to the heat dissipator.

BRIEF DESCRIPTION OF THE DRAWINGS

Reference is made for the purpose of further explanation of the invention to the drawings, in which an exemplary embodiment of a valve reactor is illustrated diagrammatically.

FIG. 4 shows a side view of an embodiment of the present invention.

FIG. 5 illustrates a sectional representation of the insulating casing of a reactor subcore according to an embodiment of the present invention.

DETAILED DESCRIPTION

Figure 1:
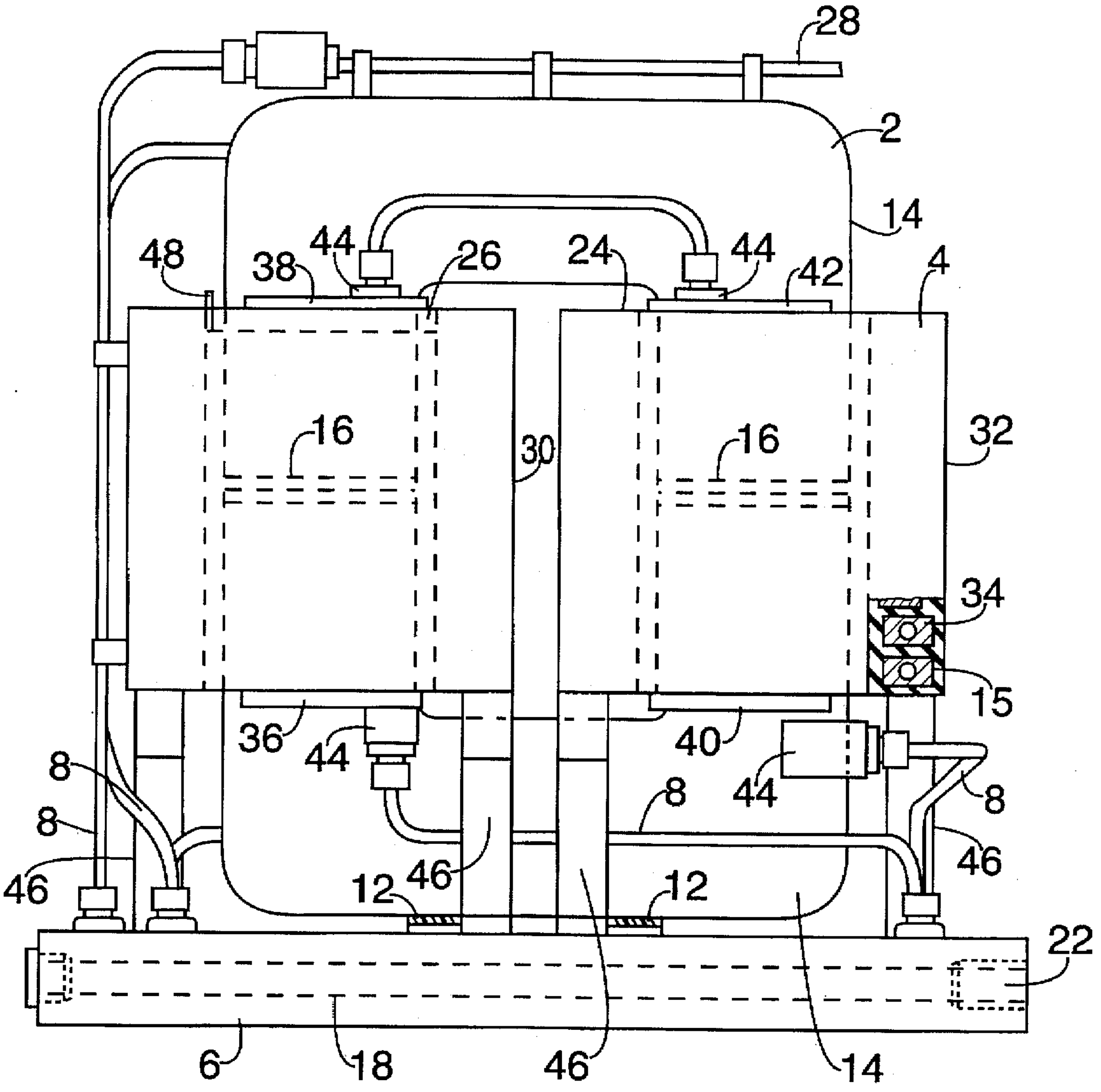
FIG. 1 shows a side view of a valve reactor according to an embodiment of the present invention.
Figure 2:
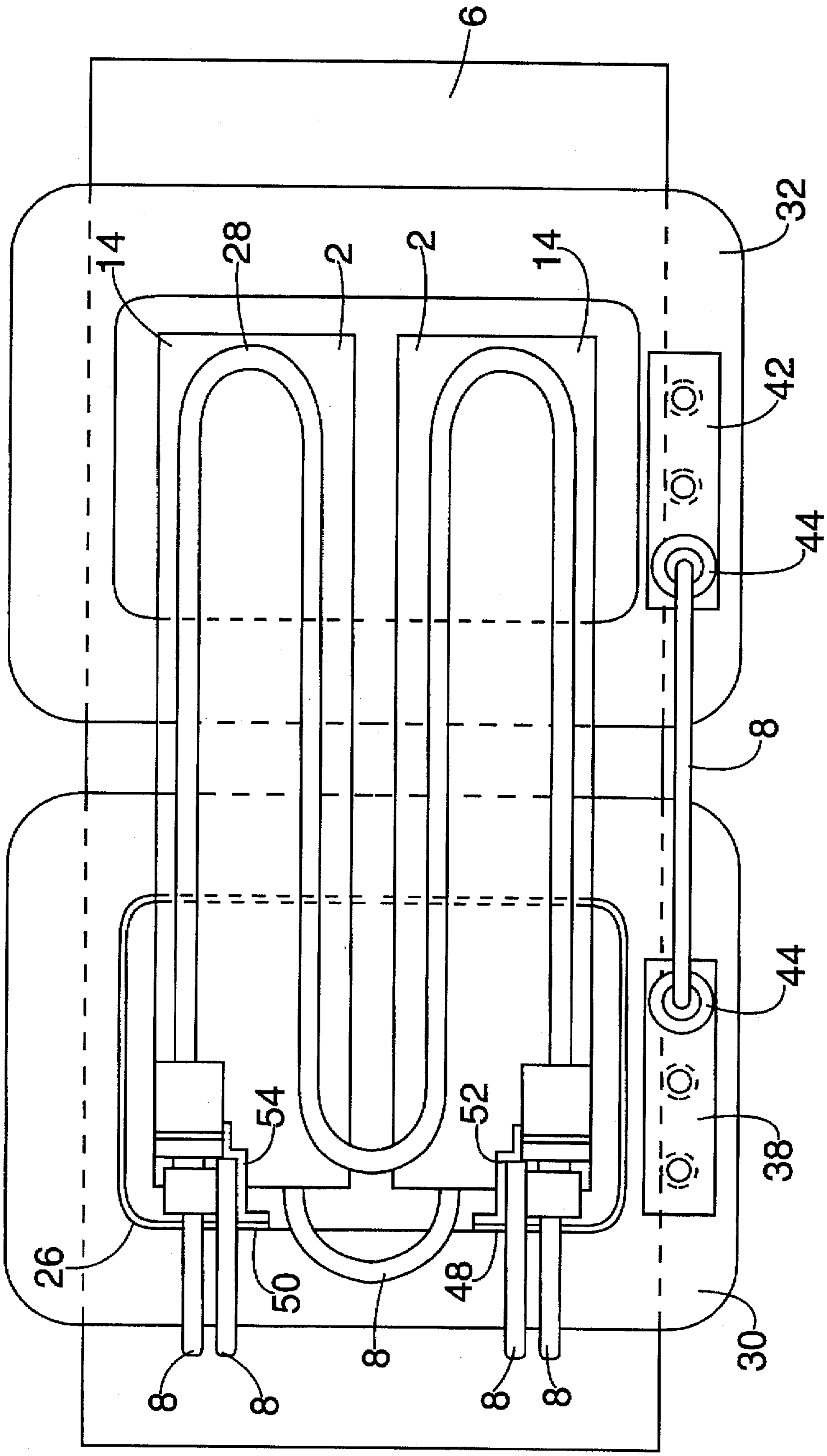
FIG. 2 shows a plan view of an embodiment of the present invention.
Figure 3:
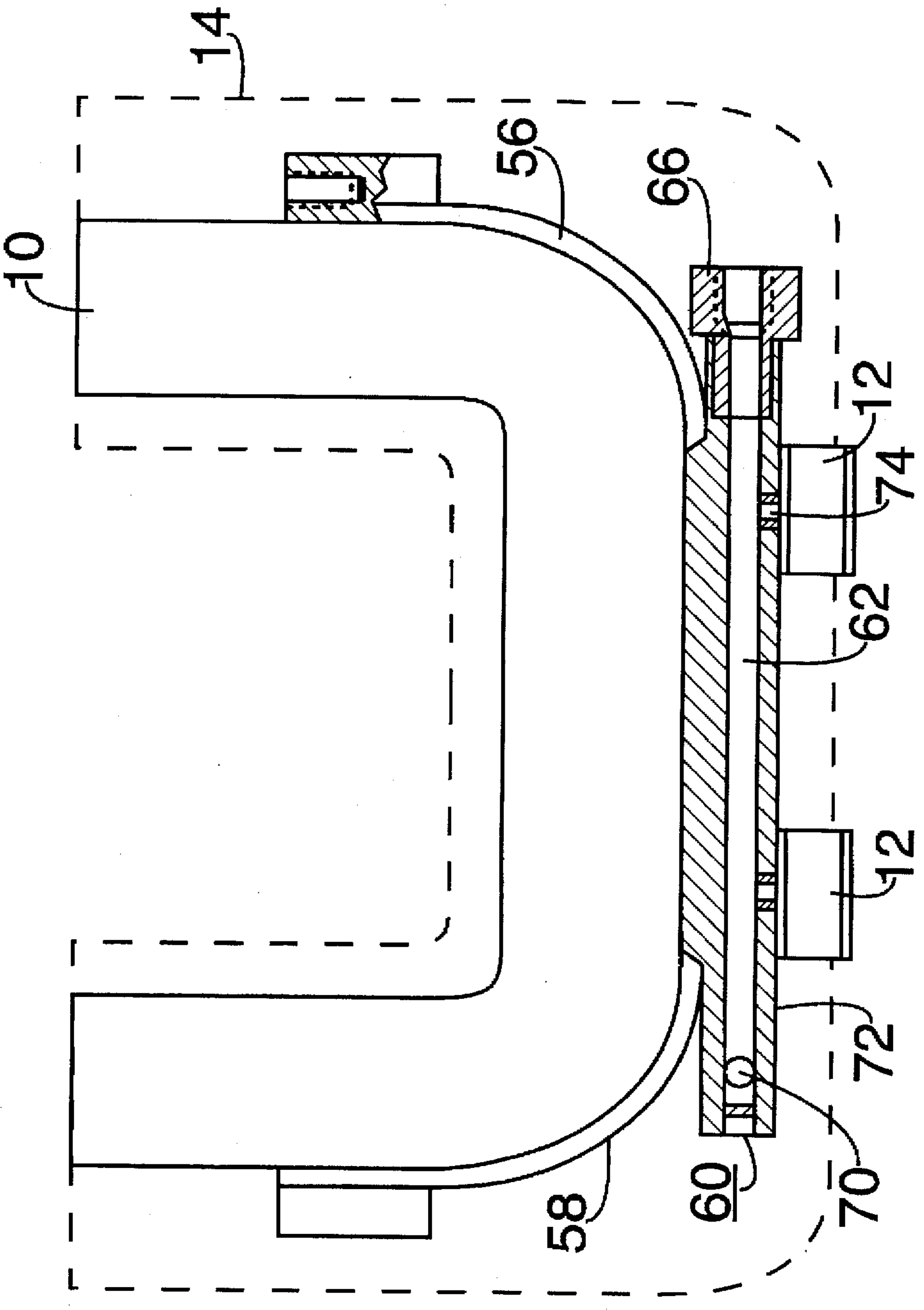
FIG. 3 shows a reactor subcore of the valve reactor according to an embodiment of the invention.

FIG. 1 illustrates a valve reactor according to the invention, in particular for a high-voltage DC transmission installation. The embodiment includes a reactor core 2, a reactor coil 4, a baseplate 6 and cooling lines 8. The reactor core 2 of this valve reactor includes two U-shaped reactor subcores, of which more detail is shown in FIG. 3. As can also be seen in FIG. 2, the valve reactor has two reactor cores 2, which are arranged parallel to one another. These reactor cores 2 are arranged in a self-supporting fashion on the baseplate 6 by means of buffers 12, which may be, for example, rubber-metal vibration damper buffers or rubber buffers. These buffers 12 serve not only as vibration dampers, but also as fastening means for the reactor core 2. Furthermore, the reactor subcores 10 are provided in each case with an insulating casing 14, also designated as a plastic shield, in two insulating casings 14 of a reactor core 2. These may be connected to one another at the ends of the limbs, for example, by means of a shrink sleeve 16. Leading to and from the cores 2 are cooling lines 8 which cool the latter by means of liquid. These cooling lines 8 are connected to the distribution pipe 18 and to a collecting pipe of the baseplate 6, but only the distribution pipe 18 is represented (by means of a broken line) in this figure. Each pipe of this baseplate 6 is provided with a connection 22 to, in each case, one cooling line of a stage of the HVDCT installation can be connected.

The reactor coil 4 has a primary winding 24, a secondary winding 26 and a secondary resistor 28. The primary winding 24 has two winding sections 30 and 32 which in each case are wound from a hollow conductor 34 and encapsulated. Liquid coolant flows through these hollow conductors 34. The winding sections 30 and 32 of the primary winding 24 are connected in series electrically and for purposes of circulation of coolant. As is shown in FIG. 2, each winding section 30 or 32 of the primary winding 24 has connected to it a pair of limbs of the cores 2 of the valve reactor. The ends 15 of the hollow conductor 34 of each winding 30 and 32 are provided with an electrical connecting device 36, 38 and 40, 42. Each connecting device 36, 38, 40 and 42 is of plate-shaped design and is provided with a connection 44 for receiving a cooling line 8. Each connecting device 36, 38, 40, 42 is provided with two threaded bores for the purpose of fastening an electric line or a busbar. The two winding sections 30 and 32 of the primary winding 24 are respectively releasably connected to the baseplate 6 by a plurality of insulating supports 46.

The secondary winding 26 has only one turn and is accommodated within the winding section 30 of the primary winding 24. The electrical connections 48 and 50 of this secondary winding 26 lead out of the winding section 30. As is shown in FIG. 2, the one turn of the secondary winding 26 is not closed. Furthermore, this secondary winding 26 does not have a hollow conductor 34, but may have a litz wire.

The secondary resistor 28 is connected electrically in parallel with this secondary winding 26. This secondary resistor 28 is cooled by means of liquid. Provided as a liquid cooled secondary resistor is a stainless steel pipe which is mounted on the plastic shield 14 of the cores 2 of the valve reactor. According to this figure, the same is laid in a meandering fashion. On the input side, the liquid cooled secondary resistor 28 is connected via a cooling line 8 to the distribution pipe 18, and on the output side likewise via a cooling line 8 to a collecting pipe (not shown) of the baseplate 6. Furthermore, the secondary resistor 28 is connected in an electrically conductive fashion to the electrical connections 48 and 50 of the secondary winding 26 by means of two connecting pieces 52 and 54. This secondary resistor 28 serves to enhance the damping ratio of the valve reactor. As a result, the cores 2 are relieved, and less power loss in the cores 2 is converted into heat.

Represented in FIG. 3 is a U-shaped reactor subcore 10, and its side view from the right is represented in detail in FIG. 4. This reactor subcore 10 is provided with a part of a clamping frame 56, which is provided on its free surface 58, with a heat dissipator 60. The heat dissipator 60 can also be a component of a part of the clamping frame 56. The heat dissipator 60 has at least two cooling ducts 62 and 64, of which only one can be seen in this representation. At one end, these cooling ducts 62 and 64 are provided with connections 66 and 68, and are connected at the other end to one another by means of a connecting pipe 70. Stainless steel bolts are provided as inlet and outlet connections 66 and 68. The side 72 of the heat dissipator 60 which is averted from the limbs is provided with two threaded bores 74 in which the buffers 12, represented here as rubber-metal vibration damper buffers, are screwed in.

After the last thermal treatment of the core 2, which is at this instant still not divided into subcores 10, the two parts of the clamping frame 56 are adapted to the core 2 and fastened by means of varnish. This is performed as follows:

The frame parts and the core 2 are braced by means of releasable fastening elements (not represented) and by means of fastening screws. The frame 56 is seated over as large an area as possible on the core 2 (after the annealing process, the core winding is relatively "soft"). Thereafter, the unit is soaked in an appropriate varnish under vacuum. After the varnish has dried out, the fastening elements and the fastening screws are removed and the core is separated into two identical pieces (U-shaped reactor subcores 10, which may be strip-wound cores).

Owing to the fact that the parts of the clamping frame 56 are connected to the subcores 10 by the varnish layer, the heat produced in the subcores 10 is conducted by thermal conduction from the clamping frame 56 via heat dissipators 60, through which liquid coolant flows, with the result that very intensive cooling is guaranteed. As is seen in FIGS. 1 and 2, the cooling ducts 62 and 64 of the two heat dissipators 60 of one reactor core 2, in each case, are connected by cooling lines 8 to the distribution pipe and the collecting pipe, respectively, of the baseplate 6. The lower and the upper heat dissipators 60 of the two reactor cores 2 are respectively connected in series by means of a cooling line 8.

The position of the insulating casing 14 of a reactor subcore 10 is indicated in FIG. 3 by means of a broken line. FIG. 5 shows a section through this insulating casing 14. Here, the representation of the reactor subcore 10 has been dispensed with for the sake of clarity. The position of the reactor subcore 10 is indicated only by a broken line. As may be seen in this representation, the plastic shield 14 of a reactor subcore 10 has two parts 76 and 78. These two parts 76 and 78 of the insulating casing 14 are hooked together. The part 78 forms the side wall, running-around the outside of the insulating casing 14. This plastic shield 14 is held at a distance from the side walls of the reactor subcore 10 by elastic distance pieces 80. The noise level of the subcore 10 is damped by means of this plastic shield 14.

This configuration produces a liquid-cooled valve reactor, in particular for a high-voltage DC transmission installation, whose cores 2 are arranged in a self-supporting fashion and which reactor can dissipate heat with high efficiency by means of liquid coolant.

What is claimed is:

1. A liquid-cooled valve reactor, in particular for a high-voltage DC transmission installation, comprising:

two U-shaped reactor subcores, each of said subcores having an insulating casing, and each of said subcores braced by means of a clamping frame, said clamping frame having at least one surface on which is mounted a heat dissipator;

a reactor coil, having a primary winding with two winding sections wound from a hollow conductor and a secondary winding;

such that said reactor subcores are each provided with a liquid-cooled secondary resistor which is connected electrically in parallel with the secondary winding;

a baseplate on which is mounted said primary winding and said reactor subcores.

2. The liquid-cooled valve reactor of claim 1, wherein said heat dissipator further comprises at least two cooling ducts disposed with connections at one end of said heat dissipator, wherein said cooling ducts are connected to one another at the other end by a connecting pipe.

3. The liquid-cooled valve reactor of claim 1, wherein said baseplate further comprises a distribution pipe and a collecting pipe for liquid coolant, said distribution pipe and said collecting pipe connected to said subcores via at least one cooling line.

4. The liquid-cooled valve reactor of claim 1, wherein said liquid-cooled secondary resistor is a stainless steel pipe.

5. The liquid-cooled valve reactor of claim 1, wherein said secondary winding has only one turn, said turn disposed within a winding section of the primary winding.

6. The liquid-cooled valve reactor of claim 1, wherein said insulating casing of each reactor subcore includes two separate joinable portions.

7. The liquid-cooled valve reactor of claim 1, further comprising a buffer connected to said heat dissipator.

8. The liquid-cooled valve reactor of claim 2, wherein said connections on said cooling ducts of said heat dissipator are formed from stainless steel.

9. The liquid-cooled valve reactor of claim 2, wherein said baseplate further comprises a distribution pipe and a collecting pipe for liquid coolant, said distribution pipe and said collecting pipe connected to said subcores via at least one cooling line.

10. The liquid-cooled valve reactor of claim 4, wherein said secondary winding has only one turn, said turn disposed within a winding section of the primary winding.

11. The liquid-cooled valve reactor of claim 2, further comprising a buffer connected to said heat dissipator.

* * * * *